(12) United States Patent
Choi et al.

(10) Patent No.: US 10,177,339 B2
(45) Date of Patent: Jan. 8, 2019

(54) ORGANIC LIGHT-EMITTING DISPLAY APPARATUS INCLUDING A FLEXIBLE SUBSTRATE HAVING A FOLDABLE NON-DISPLAY REGION AND METHOD OF MANUFACTURING THE SAME

(71) Applicant: Samsung Display Co., Ltd., Yongin-si, Gyeonggi-do (KR)

(72) Inventors: Jungmi Choi, Yongin-si (KR); Yonghwan Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 30 days.

(21) Appl. No.: 15/608,930

(22) Filed: May 30, 2017

(65) Prior Publication Data

US 2017/0263881 A1    Sep. 14, 2017

Related U.S. Application Data

(62) Division of application No. 13/470,211, filed on May 11, 2012, now Pat. No. 9,668,318.

(30) Foreign Application Priority Data

Sep. 22, 2011 (KR) .................. 10-2011-0095821

(51) Int. Cl.
| | |
|---|---|
| *H01L 51/52* | (2006.01) |
| *H05K 3/30* | (2006.01) |
| *H05B 33/12* | (2006.01) |
| *H01L 51/00* | (2006.01) |
| *H05B 33/10* | (2006.01) |

(52) U.S. Cl.
CPC ........ *H01L 51/524* (2013.01); *H01L 51/0097* (2013.01); *H05B 33/10* (2013.01); *H05B 33/12* (2013.01); *H05K 3/30* (2013.01); *Y02E 10/549* (2013.01); *Y02P 70/521* (2015.11); *Y10T 29/4913* (2015.01); *Y10T 29/49131* (2015.01)

(58) Field of Classification Search
CPC .... H05B 33/10; H01L 51/524; H01L 51/0097
See application file for complete search history.

(56) References Cited

U.S. PATENT DOCUMENTS

| | | | |
|---|---|---|---|
| 7,326,313 | B2 | 2/2008 | Lee et al. |
| 7,372,200 | B2 | 5/2008 | Yamazaki |
| 7,486,017 | B2 | 2/2009 | Ohkubo |
| 7,952,101 | B2 | 5/2011 | Yamazaki et al. |
| 2010/0253902 | A1 | 10/2010 | Yamazaki et al. |
| 2010/0308335 | A1 | 12/2010 | Kim et al. |
| 2011/0121355 | A1 | 5/2011 | Bae et al. |

(Continued)

FOREIGN PATENT DOCUMENTS

| | | |
|---|---|---|
| JP | 2005-017567 | 1/2005 |
| JP | 2005-251671 A | 9/2005 |

(Continued)

*Primary Examiner* — Joseph L Williams
(74) *Attorney, Agent, or Firm* — Lewis Roca Rothgerber Christie LLP

(57) ABSTRACT

An organic light-emitting display apparatus includes a flexible substrate having a display region and a non-display region located at an outer region of the display region, the non-display region being folded with respect to the display region; at least one organic light-emitting diode (OLED) on the display region of the flexible substrate; and an encapsulation member encapsulating the display region.

20 Claims, 8 Drawing Sheets

(56) References Cited

U.S. PATENT DOCUMENTS

| | | |
|---|---|---|
| 2011/0285607 A1 | 11/2011 | Kim |
| 2012/0007107 A1 | 1/2012 | Choi |
| 2012/0218219 A1 | 8/2012 | Rappoport et al. |
| 2013/0076649 A1 | 3/2013 | Myers et al. |

FOREIGN PATENT DOCUMENTS

| | | |
|---|---|---|
| JP | 2008-153004 A | 7/2008 |
| JP | 2011-47977 A | 3/2011 |
| KR | 10-2006-0028537 | 3/2006 |
| KR | 10-2007-0077493 | 7/2007 |
| KR | 10-2008-0011537 | 2/2008 |
| KR | 10-2008-0073252 | 8/2008 |
| KR | 10-2009-0033861 | 4/2009 |
| KR | 10-2010-0111622 | 10/2010 |

ORGANIC LIGHT-EMITTING DISPLAY APPARATUS INCLUDING A FLEXIBLE SUBSTRATE HAVING A FOLDABLE NON-DISPLAY REGION AND METHOD OF MANUFACTURING THE SAME

CROSS-REFERENCE TO RELATED PATENT APPLICATION

This application is a divisional of U.S. patent application Ser. No. 13/470,211, filed May 11, 2012, which claims priority to and the benefit of Korean Patent Application No. 10-2011-0095821, filed Sep. 22, 2011, the entire content of both of which is incorporated herein by reference.

BACKGROUND

1. Field

The present invention relates to an organic light-emitting display apparatus and a method of manufacturing the organic light-emitting display apparatus.

2. Description of Related Art

An organic light-emitting display apparatus includes a hole injection electrode, an electron injection electrode, and an organic emitting layer formed therebetween, and is a self-light-emitting display apparatus in which holes injected from an anode and electrons injected from a cathode are recombined in the organic emitting layer and then disappear while emitting light.

The organic light-emitting display apparatus is expected to become a next generation display apparatus due to its high quality features such as low power consumption, high brightness, and fast response speed.

The organic light-emitting display apparatus includes a display region for displaying an image, and a non-display region including various circuits and wirings for supplying an image signal to the display region. The non-display region is formed at an outer region of the display region and is disposed on the same level as the display region.

Recently, there is an increasing demand for high display quality and various applications with respect to organic light-emitting display apparatuses or large organic light-emitting display apparatuses, so that the number of circuits and wirings disposed in the non-display region is reduced.

SUMMARY

Exemplary embodiments according to the present invention provide an organic light-emitting display apparatus that has a non-display region having a foldable structure, so that a design margin with respect to a dead space may be assured by allowing the non-display region to have a region that is as large as a foldable region, and an aesthetic sense may be improved by significantly decreasing the size of the non-display region that is recognizable by a user.

According to an aspect of embodiments of the present invention, there is provided an organic light-emitting display apparatus including a flexible substrate having a display region and a non-display region located at an outer region of the display region, the non-display region being folded with respect to the display region; at least one organic light-emitting diode (OLED) on the display region of the flexible substrate; and an encapsulation member encapsulating the display region.

The encapsulation member may include a thin film.

The thin film may have a plurality of thin films that include at least one of an organic thin film or an inorganic thin film.

The non-display region may be folded to cover at least a side surface of the thin film.

The encapsulation member may include an inflexible substrate, and the organic light-emitting display apparatus may further include a sealant that adheres the inflexible substrate and the flexible substrate together. The sealant may surround the display region.

The inflexible substrate may include a glass substrate.

The sealant may include a glass frit.

The sealant may include an organic sealant.

The organic light-emitting display apparatus may further include a supporting substrate that supports the flexible substrate and is formed on a surface of the flexible substrate that is opposite to a surface on which the display region is formed.

The supporting substrate may include a glass substrate.

The size of the supporting substrate may be less than the size of the flexible substrate.

The non-display region may be folded to cover a side surface of the supporting substrate.

The non-display region may be folded to cover a side surface of the encapsulation member.

The flexible substrate may include a plastic substrate.

The organic light-emitting display apparatus may further include a barrier layer that is formed on the flexible substrate and is formed between the display region and the non-display region.

The organic light-emitting display apparatus may further include an emitting unit including the at least one OLED, and a device/wiring layer on the flexible substrate and including a device and a wiring that are electrically connected to the at least one OLED.

The organic light-emitting display apparatus may further include a driving circuit unit and a wiring unit at the non-display region, wherein the driving circuit and the wiring unit are electrically connected to the display region.

According to another aspect of the present invention, there is provided a method of manufacturing an organic light-emitting display apparatus, the method including (a) forming a flexible substrate on a supporting substrate, the flexible substrate having a display region and a non-display region at an outer region of the display region; (b) forming at least one organic light-emitting diode (OLED) on the display region of the flexible substrate; (c) forming an encapsulation member on the flexible substrate to encapsulate the display region; (d) separating at least a portion of the supporting substrate from the flexible substrate; and (e) folding the non-display region of the flexible substrate with respect to the display region.

The forming (a) may include an operation of forming the flexible substrate as a plastic substrate.

After the forming (a), the method may further include forming a barrier layer on the flexible substrate.

The forming (c) may include an operation of forming the encapsulation member as a thin film.

The thin film may be formed by stacking a plurality of thin films that include at least one of an organic thin film or an inorganic thin film.

In the separating (d), the supporting substrate may be entirely separated from the flexible substrate, and in the folding (e), the non-display region may be folded to cover a side surface of the thin film.

The forming (c) may include operations of forming the encapsulation member as an inflexible substrate and adhering the inflexible substrate and the flexible substrate together by using a sealant.

The inflexible substrate may be formed as a glass substrate.

The sealant may include a glass frit.

The sealant may include an organic sealant.

In the separating (d), a region of the supporting substrate that corresponds to the non-display region may be separated from the flexible substrate.

In the folding (e), the non-display region may be folded to cover a side surface of the supporting substrate.

In the folding (e), the non-display region may be folded to cover a side surface of the encapsulation member.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, the present invention will be described in detail by explaining exemplary embodiments of the invention with reference to the attached drawings.

Expressions such as "at least one of," when preceding a list of elements, modify the entire list of elements and do not modify the individual elements of the list.

Figure 1:
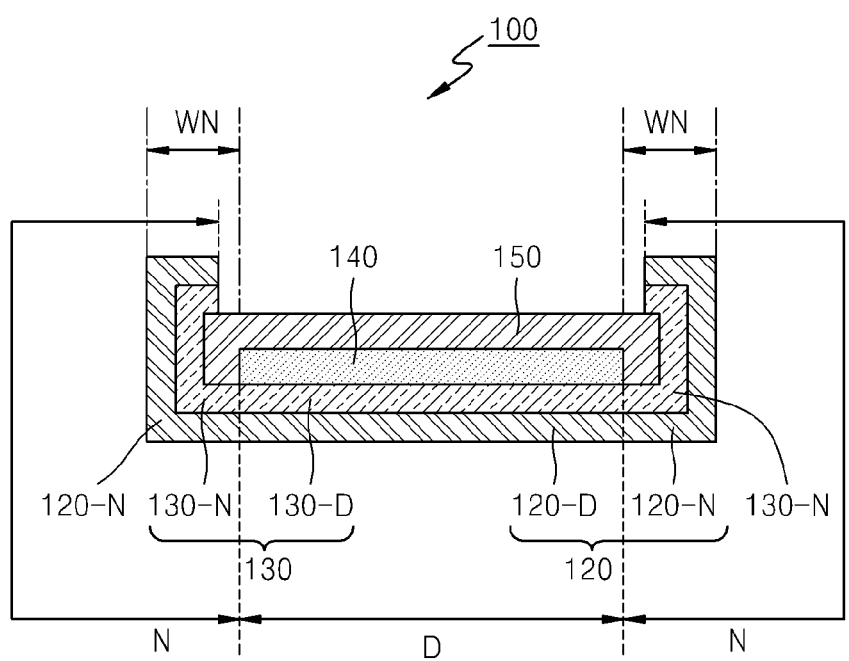
FIG. 1 is a cross-sectional view of an organic light-emitting display apparatus according to a first embodiment of the present invention.

FIG. 1 is a cross-sectional view of an organic light-emitting display apparatus 100 according to a first embodiment of the present invention.

Referring to FIG. 1, the organic light-emitting display apparatus 100 includes a flexible substrate 120, a display region D disposed on the flexible substrate 120, a non-display region N folded with respect to the display region D, and a thin film 150 encapsulating the display region D.

The flexible substrate 120 may be formed of a plastic material such as polyethylene naphthalate, polyethylene terephthalate, polycarbonate, polyarylate, polyetherimide, polyethersulfone, polyimide, or the like, which has excellent heat-resistance and durability. However, a material of the flexible substrate 120 is not limited thereto, and the flexible substrate 120 may be formed of one of various flexible materials.

The flexible substrate 120 may be divided into a portion 120-D corresponding to the display region D that displays an image, and a portion 120-N corresponding to the non-display region N that is disposed at an outer region of the display region D. As will be described below, the portion 120-N of the flexible substrate 120, which corresponds to the non-display region N, and a device/wiring layer 130 have folded structures to cover a side surface of the thin film 150.

Although not illustrated in FIG. 1, a barrier layer (not shown) may be further arranged on the flexible substrate 120. The barrier layer may be formed of at least one of the group consisting of inorganic layers and organic layers. The barrier layer may prevent an unnecessary (e.g., undesirable) component from passing through the flexible substrate 120 and then penetrating into the display region D.

The device/wiring layer 130 may be formed on the flexible substrate 120. The device/wiring layer 130 may be divided into a portion 130-D corresponding to the display region D, and a portion 130-N corresponding to the non-display region N at the outer region of the display region D.

The portion 130-D of the device/wiring layer 130, which corresponds to the display region D, may include a driving thin-film transistor (TFT) (e.g., refer to FIG. 3) for driving an organic light-emitting diode (OLED) (e.g., refer to FIG. 3) to be described below, a switching TFT (not shown), a capacitor, and wirings (not shown) that are connected to the driving TFT, the switching TFT, or the capacitor.

The portion 130-N of the device/wiring layer 130, which corresponds to the non-display region N, may include various circuits, wirings, pad electrodes, or the like, which drive an OLED of an emitting unit 140 disposed in the display region D, and supply an image signal. The portion 130-N of the device/wiring layer 130, which corresponds to the non-display region N, and the portion 120-N of the flexible substrate 120, which corresponds to the non-display region N, are folded to cover the side surface of the thin film 150.

Since the organic light-emitting display apparatus 100 has a structure in which the non-display region N is folded with respect to the display region D, when a user sees the organic light-emitting display apparatus 100 in front of the emitting unit 140 that is the display region D, a width WN of the non-display region N, which is actually seen by the user, is decreased, compared to a width $WN_0$ (e.g., refer to FIG. 2) of the non-display region N before being folded. Thus, the user may notice that a border formed between the display region D and the non-display region N is significantly decreased.

Since the non-display region N does not produce an image, the non-display region N may be referred to as a dead space of a display apparatus. In order to decrease the dead space, the number of various circuits and wirings disposed in the non-display region N may be reduced, and/or a line width of the circuits and wirings may be decreased. In the present embodiment, the number of various circuits, wirings, and/or pad electrodes formed in the portion 130-N of the device/wiring layer 130, which corresponds to the non-display region N, may be reduced, and/or a line width of the circuits, wirings and/or pad electrodes, may be decreased. However, due to a recent demand for high display quality and various applications with respect to organic light-emitting display apparatuses or large organic light-emitting display apparatuses, it is difficult to reduce the number of circuits and wirings and/or to decrease the line width in a manufacturing process. However, in the organic light-emitting display apparatus 100, the portion 130-N of the device/wiring layer 130, which corresponds to the non-display region N, is folded so that it is possible to create an effect in which the dead space is decreased. Thus, it is possible to assure a sufficiently large manufacturing margin with respect to the dead space before the non-display region N is folded, so that it may not be necessary to reduce the number of circuits or wirings or to decrease the line width (Effect 2).

The emitting unit 140 corresponding to the display region D is formed on the device/wiring layer 130. The emitting unit 140 includes at least one OLED (e.g., refer to FIG. 2).

The thin film 150 that encapsulates the display region D is formed on the emitting unit 140. Although not illustrated in FIG. 1, the thin film 150 may have a structure in which a plurality of inorganic layers are formed or inorganic layers and organic layers are alternately stacked.

If the thin film 150 encapsulates the organic light-emitting display apparatus 100, impurities such as moisture and oxygen that can reduce a lifetime of an OLED may easily penetrate into the emitting unit 140 through the side surface of the thin film 150. However, in the organic light-emitting display apparatus 100 according to the present embodiment, the portion 130-N of the device/wiring layer 130, which corresponds to the non-display region N, and the flexible substrate 120 are folded to cover the side surface of the thin film 150, so that it is possible to prevent or reduce the penetration of the impurities through the side surface of the thin film 150. Thus, a lifetime of the organic light-emitting display apparatus 100 may be extended (Effect 3).

Figure 2:
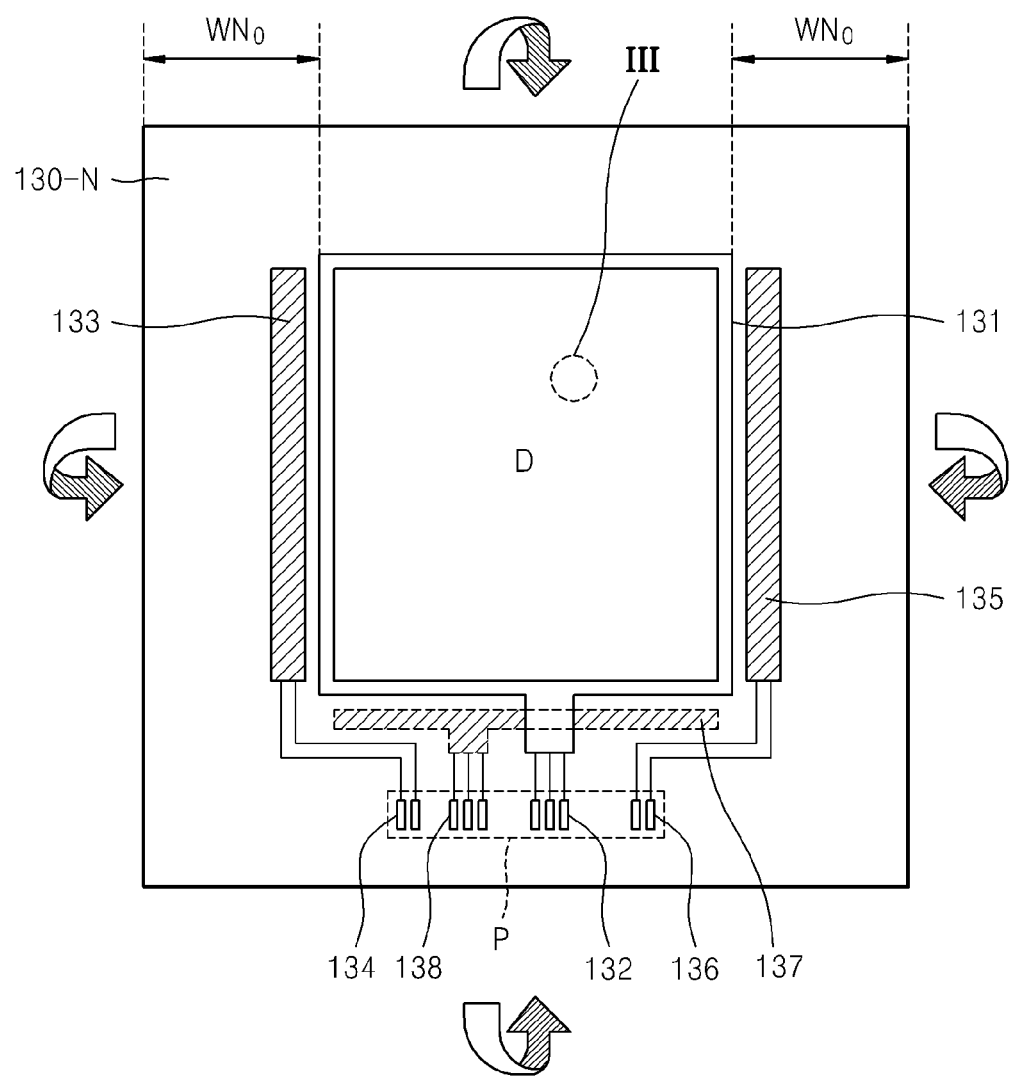
FIG. 2 is a plan view illustrating a display region and a non-display region of the organic light-emitting display apparatus of FIG. 1 before the non-display region is folded.

FIG. 2 is a plan view illustrating the display region D and the non-display region N of FIG. 1 before the non-display region N is folded.

Referring to FIG. 2, an electrode power supply line 131 for supplying power to an opposite electrode 143 (e.g., refer to FIG. 3) that is a common electrode, and its terminal 132 are disposed in the portion 130-N of the device/wiring layer 130, which corresponds to the non-display region N. Also, a scanning circuit unit 133 for delivering a driving signal to the display region D, and its terminal 134 are disposed in the portion 130-N of the device/wiring layer 130, which corresponds to the non-display region N. Also, a data circuit unit 135 for delivering a data signal to the display region D, and its terminal 136 are disposed in the portion 130-N of the device/wiring layer 130, which corresponds to the non-display region N. Also, a pad portion P, in which the terminals 132, 134, 136, and 138 are disposed, is formed in the portion 130-N of the device/wiring layer 130, which corresponds to the non-display region N. The circuits, wirings, and terminals shown in FIG. 2 are exemplarily configured on the portion 130-N of the device/wiring layer 130, which corresponds to the non-display region N. That is, in some embodiments, the circuits, wirings, and terminals may have a different configuration than that of FIG. 2.

As illustrated in FIG. 2, a sufficient width $WN_0$ of the dead space is assured in upper, lower, left, and right regions of the display region D before the portion 130-N of the device/wiring layer 130, which corresponds to the non-display region N, is folded, so that it is not necessary to reduce the number of circuits or wirings or to decrease a line width.

Figure 3:
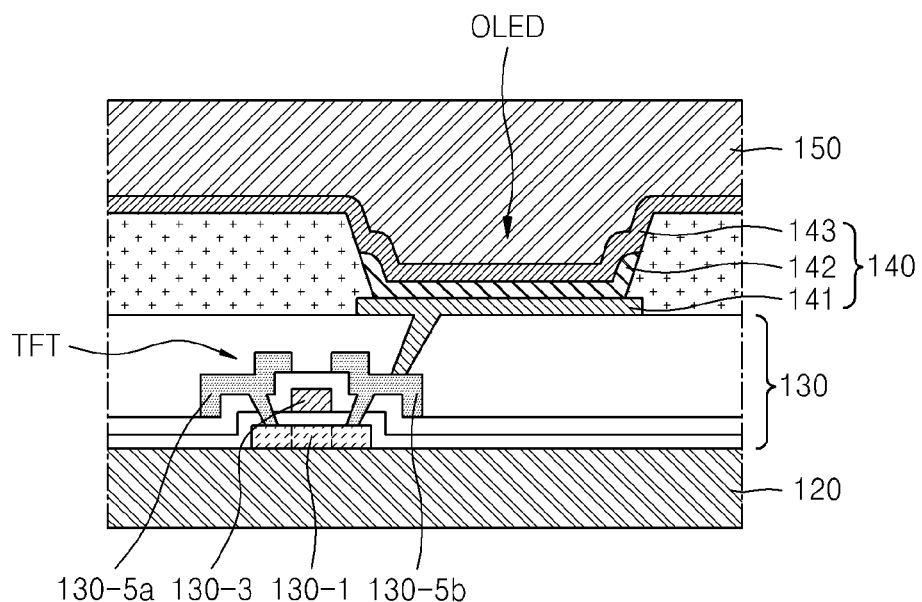
FIG. 3 is a magnified cross-sectional view of a portion III of FIG. 2.

FIG. 3 is a magnified cross-sectional view of a portion III of FIG. 2. Referring to FIG. 3, at least one OLED is formed in the emitting unit 140 of the display region D.

The OLED includes a pixel electrode 141, an organic emitting layer 142 formed on the pixel electrode 141, and the opposite electrode 143 as the common electrode formed on the organic emitting layer 142.

The pixel electrode 141 may be a positive (+) electrode that is a hole injection electrode, and the opposite electrode 143 that is the common electrode may be a negative (−) electrode that is an electron injection electrode. However, one or more embodiments of the present invention are not limited thereto, and according to a driving method of the organic light-emitting display apparatus 100, the pixel electrode 141 may be a negative electrode, and the common electrode 143 may be a positive electrode. Holes and electrons are injected into the organic emitting layer 142 from the pixel electrode 141 and the opposite electrode 143, respectively. When excitons formed by combining the injected holes and electrons drop from an excited state to a ground state, emission occurs.

The pixel electrode 141 is electrically connected to the driving TFT formed at the device/wiring layer 130 on the flexible substrate 120. Although FIG. 3 illustrates a TFT having a top gate structure, one or more embodiments of the present invention are not limited thereto, and a TFT having one of various structures including a bottom gate structure may be used.

Also, although FIG. 3 illustrates a structure in which the OLED is formed on the device/wiring layer 130 in which the driving TFT is formed, one or more embodiments of the present invention are not limited thereto. For example, the structure may be variously changed into a structure in which the pixel electrode 141 of the OLED is formed at the same level as an active layer 130-1 of the driving TFT, a structure in which the pixel electrode 141 is formed at the same level as a gate electrode 130-3 of the driving TFT, a structure in which the pixel electrode 141 is formed at the same level as a source electrode 130-5a and a drain electrode 130-5b, or the like.

Although FIG. 3 illustrates only the driving TFT that is electrically connected to the OLED, one or more embodiments of the present invention are not limited thereto. Further, at least one switching TFT (not shown) and a storage capacitor (not shown) may be electrically connected to the OLED.

Light emitted from the organic emitting layer 142 may be emitted toward the flexible substrate 120 or the thin film 150. The present embodiment will now be described with reference to a bottom-emission type display apparatus in which an image is realized toward the flexible substrate 120. However, one or more embodiments of the present invention are not limited thereto, and the organic light-emitting display apparatus 100 may be a top-emission type display apparatus or a dual-emission type display apparatus in which an image is realized toward the thin film 150.

As in the present embodiment, in a case where the organic light-emitting display apparatus 100 is a bottom-emission type display apparatus in which an image is realized toward the flexible substrate 120, the non-display region N may be formed larger than that shown in FIG. 1. For example, the non-display region N may extend not only on the side surface of the thin film 150, but also may extend on a top surface of the thin film 150. Referring to FIG. 1, the non-display region N covers a portion of the top surface of the thin film 150. However, in a case of the bottom-emission type display apparatus, the non-display region N may further extend on a region overlapping with the display region D on the top side of the thin film 150. Thus, the manufacturing margin with respect to the dead space may be further assured. However, in a case of the top-emission type display apparatus in which an image is realized toward the thin film 150, the non-display region N may not overlap with the display region D, as shown in FIG. 1.

Although not illustrated, a protective film (not shown) may be further formed on each outer region of the flexible substrate 120 and the thin film 150. The protective film may improve the mechanical strength of the organic light-emitting display apparatus 100. Also, the protective film may have a polarizing function.

Hereinafter, a method of manufacturing the organic light-emitting display apparatus 100 according to the first embodiment will now be described.

FIGS. 4A through 4F are cross-sectional views illustrating the method of manufacturing the organic light-emitting display apparatus 100 according to the first embodiment.

Figure 4A:
FIGS. 4A through 4F are cross-sectional views illustrating a method of manufacturing the organic light-emitting display apparatus according to the first embodiment.

Referring to FIG. 4A, first, a supporting substrate 110 is arranged. The supporting substrate 110 may be a glass substrate but is not limited thereto. The supporting substrate 110 may be formed of not only a glass substrate, but may also be formed of one of various substrates capable of supporting the flexible substrate 120 and enduring a manufacturing stress while the device/wiring layer 130, the emitting unit 140, and the thin film 150 are formed on the flexible substrate 120.

Figure 4B:
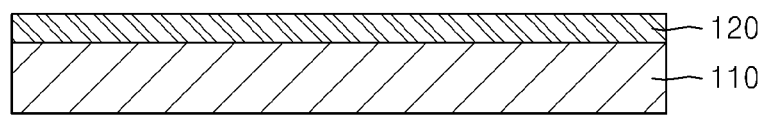

Referring to FIG. 4B, the flexible substrate 120 is formed on the supporting substrate 110. As described above, the flexible substrate 120 may be formed of a plastic material that has excellent heat-resistance and durability. Although not illustrated in FIG. 4B, a barrier layer (not shown) may be further formed on the flexible substrate 120.

Figure 4C:
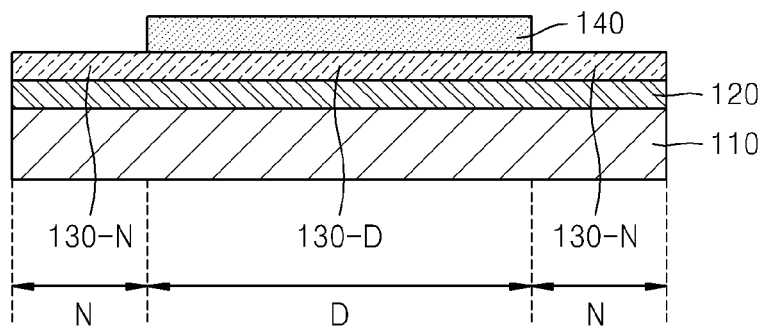

Referring to FIG. 4C, the flexible substrate 120 has the display region D and the non-display region N. In more detail, the display region D may include the emitting unit 140 in which the OLED is formed (refer to FIG. 2), and a portion 130-D of the device/wiring layer 130, which corresponds to the emitting unit 140. Also, the non-display region N may include an outer region of the device/wiring layer 130 with respect to the emitting unit 140, that is, a portion 130-N that corresponds to the non-display region N. As described above, the emitting unit 140 may be formed on the device/wiring layer 130 or may be formed at the same level as the device/wiring layer 130.

Figure 4D:
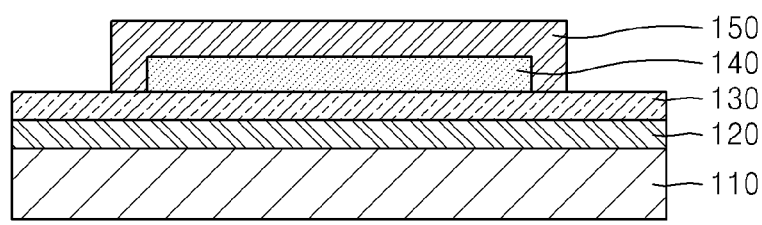

Referring to FIG. 4D, the thin film 150 is formed to cover the emitting unit 140. The thin film 150 may be formed on the emitting unit 140 by using one of various methods including a vacuum deposition method, a method using an adhesive, or the like. Although not illustrated in FIG. 4D, a protective film may be further adhered on the thin film 150.

Figure 4E:
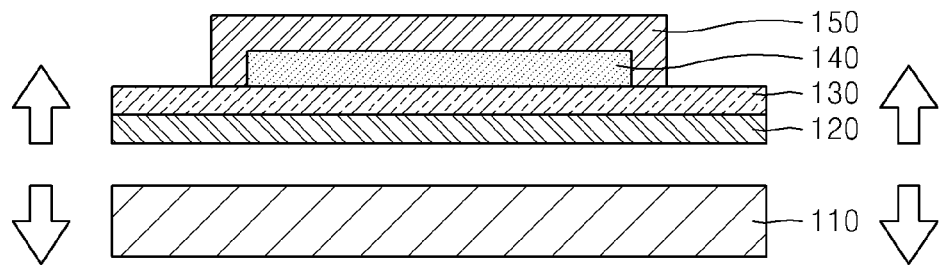

Referring to FIG. 4E, the supporting substrate 110 is separated from the flexible substrate 120. Although not illustrated in FIG. 4E, after the supporting substrate 110 is separated from the flexible substrate 120, a protective film (not shown) may be further adhered on the flexible substrate 120.

Figure 4F:
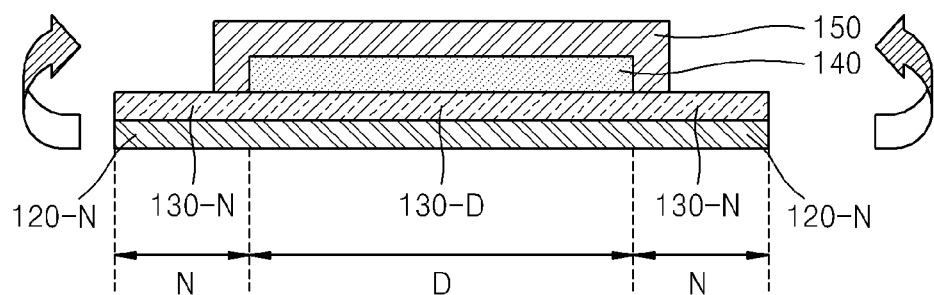

Referring to FIG. 4F, the portion 120-N of the flexible substrate 120, which corresponds to the non-display region N, and the portion 130-N of the device/wiring layer 130, which corresponds to the non-display region N, are folded with respect to the display region D. In more detail, by folding the portions 120-N and 130-N so as to sufficiently cover the side surface of the thin film 150, penetration of moisture and oxygen through the side surface of the thin film 150 is prevented or reduced. Here, an adhesive is arranged at a contact interface between the thin film 150 and the portion 130-N of the device/wiring layer 130, which corresponds to the non-display region N, so that the thin film 150 and the portion 130-N of the device/wiring layer 130, which corresponds to the non-display region N, may be firmly adhered together.

Figure 5:
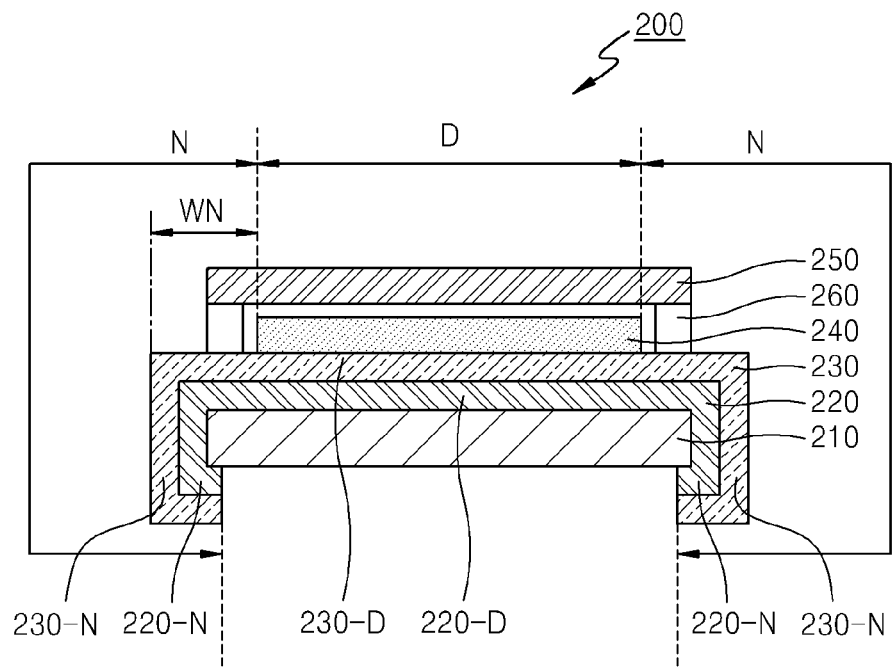
FIG. 5 is a cross-sectional view of an organic light-emitting display apparatus according to a second embodiment of the present invention.

Hereinafter, a second embodiment of the present invention will now be described. FIG. 5 is a cross-sectional view of an organic light-emitting display apparatus 200 according to the second embodiment of the present invention.

Referring to FIG. 5, the organic light-emitting display apparatus 200 includes a supporting substrate 210, a flexible substrate 220, a display region D above the flexible substrate 220, a non-display region N folded with respect to the display region D, an encapsulation substrate 250 encapsulating the display region D, and a sealant 260 adhering the flexible substrate 220 and the encapsulation substrate 250 together.

The organic light-emitting display apparatus 200 is different from the organic light-emitting display apparatus 100 of the first embodiment in that the supporting substrate 210 for supporting the flexible substrate 220 is further formed on a surface of the flexible substrate 220, which is opposite to a surface on which the display region D is formed. Also, the organic light-emitting display apparatus 200 is different from the organic light-emitting display apparatus 100 of the first embodiment in that an encapsulation member for encapsulating the display region D is not the thin film 150, but is the encapsulation substrate 250 that is an inflexible substrate such as a glass substrate, and the encapsulation substrate 250 is adhered to the flexible substrate 220 by using the sealant 260.

The supporting substrate 210 is formed of a material that has a sufficient rigidity to support the flexible substrate 220 and that is capable of enduring a manufacturing stress while a device/wiring layer 230, an emitting unit 240, and the encapsulation substrate 250 are formed on the flexible substrate 220. For example, in the present embodiment, a glass substrate is formed as the supporting substrate 210.

The size of the supporting substrate 210 is less than the size of the flexible substrate 220. The flexible substrate 220 may be divided into a portion 220-D corresponding to the display region D that displays an image, and a portion 220-N corresponding to the non-display region N that is disposed in an outer region of the display region D. The portion 230-N of the device/wiring layer 230, which corresponds to the non-display region N, and the portion 220-N of the flexible substrate 220, which corresponds to the non-display region N, have folded structures to cover a side surface of the supporting substrate 210.

The emitting unit 240 corresponding to the display region D is formed on the device/wiring layer 230. The emitting unit 240 includes at least one OLED.

The encapsulation substrate 250 that is inflexible and that encapsulates the display region D is formed on the emitting unit 240. In the present embodiment, the glass substrate being made of the same material as the supporting substrate 210 is used as the encapsulation substrate 250.

The encapsulation substrate 250 and the flexible substrate 220 are adhered together by using the sealant 260. The sealant 260 may include a glass frit having an excellent water-permeation-prevention (or water resistance) property, or may include one of various materials such as an organic sealant, a moisture absorbent, or the like.

As described above, the organic light-emitting display apparatus 200 according to the present embodiment has a structure in which the non-display region N is folded with respect to the display region D. Therefore, when a user sees the organic light-emitting display apparatus 200 in front of the emitting unit 240 that is the display region D, a width WN of the non-display region N which is actually seen by the user is decreased, as compared to a width of the non-display region N before being folded.

Thus, the user may notice that a border formed between the display region D and the non-display region N is significantly decreased.

Also, in the organic light-emitting display apparatus 200, the portion 230-N of the device/wiring layer 230, which corresponds to the non-display region N, is folded so that it is possible to create an effect in which a dead space is decreased. Thus, it is possible to assure a sufficiently large manufacturing margin with respect to the dead space before the non-display region N is folded, so that it is not necessary to reduce the number of circuits or wirings or to decrease a line width (Effect 2).

In addition, in the organic light-emitting display apparatus 200, the supporting substrate 210 supports the flexible substrate 220 so that shaking or vibration of the flexible substrate 220 may be stabilized or reduced while the organic light-emitting display apparatus 200 is moved or transported, and thus mechanical reliability of the organic light-emitting display apparatus 200 may be increased.

Also, in the organic light-emitting display apparatus 200, instead of using a thin film, the inflexible encapsulation substrate 250 is adhered to the flexible substrate 220 by using the sealant 260, so that the penetration of impurities through the side surface of the thin film may be prevented. Thus, a lifetime of the organic light-emitting display apparatus 200 may be extended.

In a case where the organic light-emitting display apparatus 200 is a top-emission type display apparatus in which an image is realized toward the encapsulation substrate 250, the non-display region N may be formed larger than that shown in FIG. 5. For example, the non-display region N may extend not only on the side surface of the supporting substrate 210, but also extend on a bottom surface of the supporting substrate 210. Referring to FIG. 5, the non-display region N covers a portion of the bottom surface of the supporting substrate 210. However, in a case of a top-emission type display apparatus, the non-display region N may further extend on a region overlapping with the display region D.

Thus, the manufacturing margin with respect to the dead space may be further assured. However, in a case of the top-emission type display apparatus in which an image is realized toward the thin film 150, the non-display region N may not overlap with the display region D, as shown in FIG. 1. Thus, a manufacturing margin with respect to the dead space may be further assured. However, in a case of a bottom-emission type display apparatus in which an image is realized toward the supporting substrate 210, the non-display region N may not overlap with the display region D, as shown in FIG. 5.

Hereinafter, a method of manufacturing the organic light-emitting display apparatus 200 according to the second embodiment will now be described.

FIGS. 6A through 6F are cross-sectional views illustrating the method of manufacturing the organic light-emitting display apparatus 200 according to the second embodiment.

Figure 6A:
FIGS. 6A through 6F are cross-sectional views illustrating a method of manufacturing the organic light-emitting display apparatus according to the second embodiment.

Referring to FIG. 6A, first, a supporting substrate 210-B is arranged. The size of the supporting substrate 210-B is greater than the size of the supporting substrate 210 of FIG. 5. Although the size of the supporting substrate 210 of FIG. 5 is less than the size of the flexible substrate 220, the size of the supporting substrate 210-B is equal to or greater than the size of the flexible substrate 220.

Figure 6B:
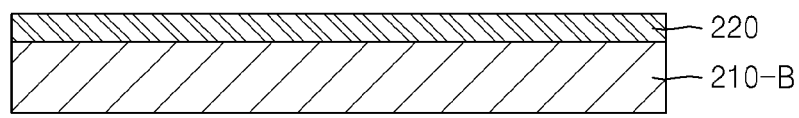

Referring to FIG. 6B, the flexible substrate 220 is formed on the supporting substrate 210-B. As described above, the flexible substrate 220 may be formed of a plastic material that has excellent heat-resistance and durability. Although not illustrated in FIG. 6B, a barrier layer (not shown) may be further formed on the flexible substrate 220.

Figure 6C:
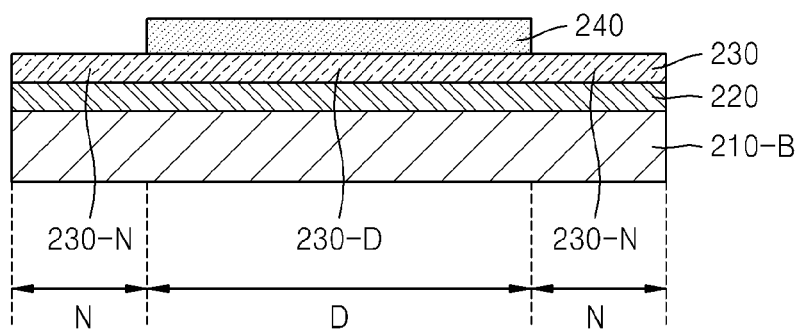

Referring to FIG. 6C, the flexible substrate 220 has the display region D and the non-display region N. In more detail, the display region D may include the emitting unit 240 in which the OLED is formed, and a portion 230-D of the device/wiring layer 230, which corresponds to the emitting unit 240. Also, the non-display region N may include a portion 230-N of the device/wiring layer 230, which corresponds to an outer region of the emitting unit 240.

Figure 6D:
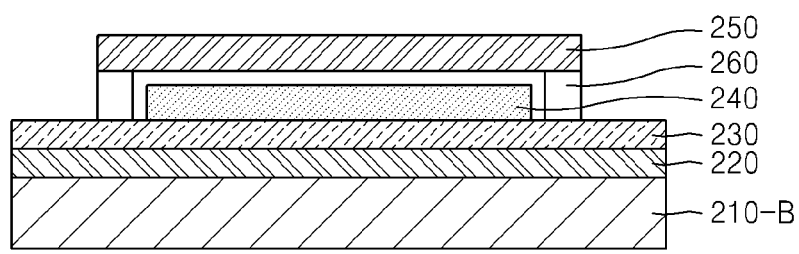

Referring to FIG. 6D, the encapsulation substrate 250 is adhered to the flexible substrate 220 by using the sealant 260 so as to encapsulate the emitting unit 240. Although not illustrated in FIG. 6D, a protective film may be further adhered on the encapsulation substrate 250.

Figure 6E:
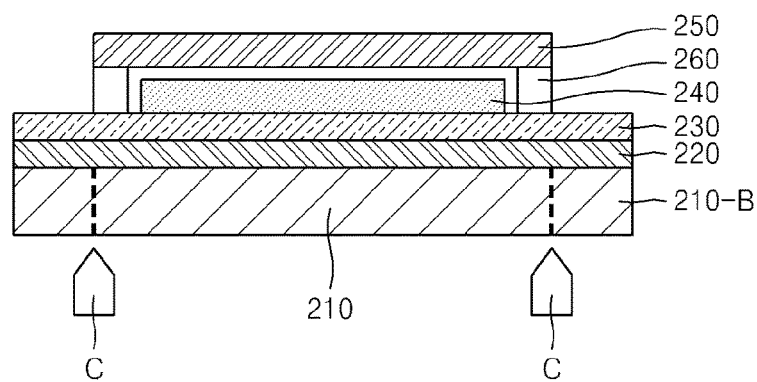

Referring to FIG. 6E, a portion of the supporting substrate 210-B is separated or removed from the flexible substrate 220. Here, a portion 210 of the supporting substrate 210-B, which corresponds to the display region D, is not separated but remains on the flexible substrate 220, and a portion of the supporting substrate 210-B, which corresponds to the non-display region N, is partly or entirely separated.

Here, one of various methods may be used to separate a portion of the supporting substrate 210-B. FIG. 6E illustrates an example of the various methods in which a portion of the supporting substrate 210-B is separated by cutting the supporting substrate 210-B with a cutter C. The portion 210 that is not separated, but remains on the flexible substrate 220, supports the flexible substrate 220, so that the mechanical reliability of the organic light-emitting display apparatus 200 may be increased.

Figure 6F:
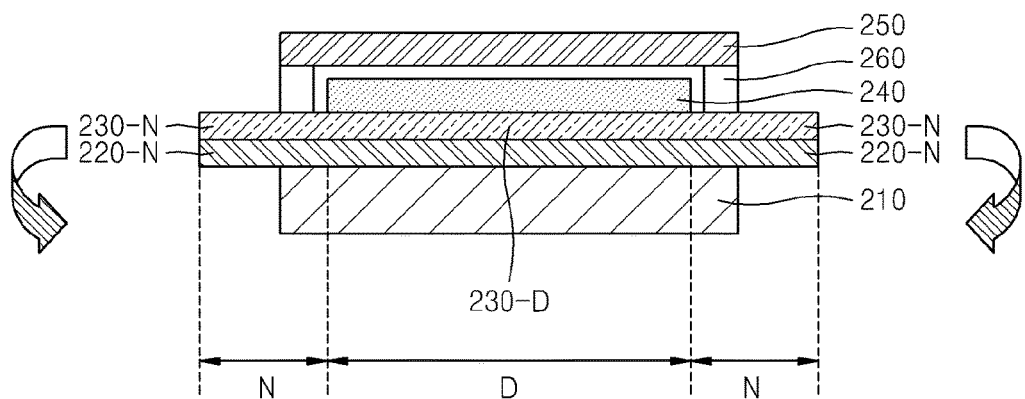

Referring to FIG. 6F, the portion 220-N of the flexible substrate 220, which corresponds to the non-display region N, and the portion 230-N of the device/wiring layer 230, which corresponds to the non-display region N, are folded with respect to the display region D. In more detail, as illustrated in FIG. 5, they are folded to cover at least the side surface of the supporting substrate 210.

Figure 7:
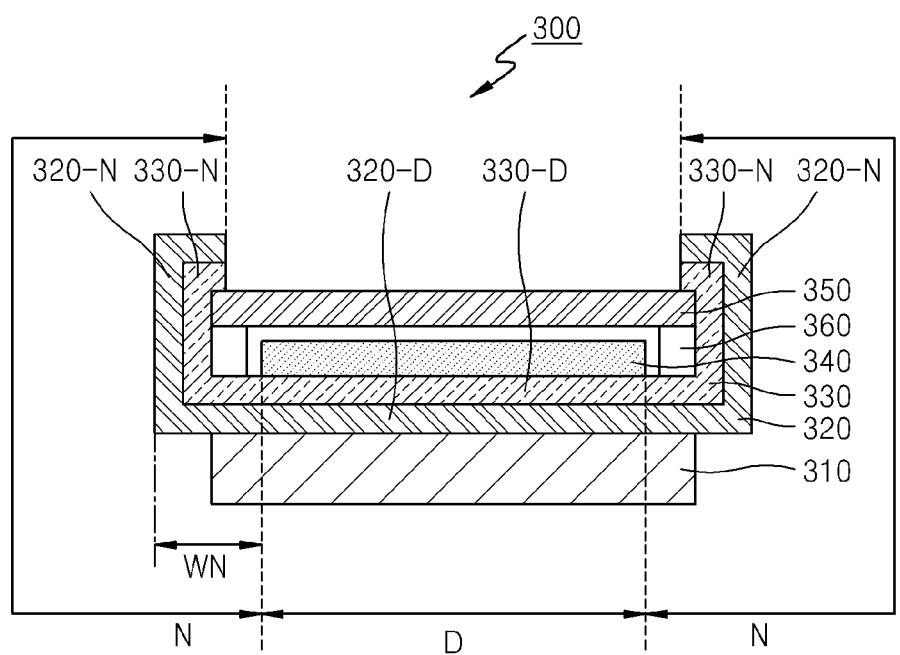
FIG. 7 is a cross-sectional view of an organic light-emitting display apparatus according to a third embodiment of the present invention.

Hereinafter, a third embodiment of the present invention will now be described. FIG. 7 is a cross-sectional view of an organic light-emitting display apparatus 300 according to the third embodiment of the present invention.

Hereinafter, the organic light-emitting display apparatus 300 according to the third embodiment will now be described with reference to a difference between the organic light-emitting display apparatus 200 according to the second embodiment and the organic light-emitting display apparatus 300 according to the third embodiment.

Referring to FIG. 7, the organic light-emitting display apparatus 300 according to the third embodiment includes a supporting substrate 310, a flexible substrate 320, a display region D disposed above the flexible substrate 320, a non-display region N folded with respect to the display region D, an encapsulation substrate 350 encapsulating the display region D, and a sealant 360 adhering the flexible substrate 320 and the encapsulation substrate 350 together.

The organic light-emitting display apparatus 300 has a structure in which a portion 320-N of the flexible substrate 320, which corresponds to the non-display region N, and a portion 330-N of a device/wiring layer 330, which corresponds to the non-display region N, have folded structures to cover a side surface of the encapsulation substrate 350. Here, the sealant 360 is within the non-display region N. In a case where the sealant 360 is formed of glass frit that has weak resistance to shock, since the non-display region N covers the glass frit, the shock on the glass frit may be lessened. Also, in a case where the sealant 360 is formed of an organic sealant that is susceptible to water permeation, since the non-display region N covers the organic sealant, the water permeation into the organic sealant may be prevented or reduced.

In a case where the organic light-emitting display apparatus 300 is a bottom-emission type display apparatus in which an image is realized toward the flexible substrate 320, the non-display region N may be formed larger than that shown in FIG. 7. For example, the non-display region N may extend not only on the side surface of the encapsulation substrate 350 but also extend on a top surface of the encapsulation substrate 350. Referring to FIG. 7, the non-display region N covers a portion of a top surface of the encapsulation substrate 350. However, in a case of the bottom-emission type display apparatus, the non-display region N may further extend on a region overlapping with the display region D. Thus, a manufacturing margin with respect to a dead space may be further assured. However, in a case of a top-emission type display apparatus in which an image is realized toward the encapsulation substrate 350, the non-display region N may not overlap with the display region D, as shown in FIG. 7.

An organic light-emitting display apparatus according to the one or more embodiments of the present invention provide the following effects:

First, since a non-display region is folded, a border of a display region by the non-display region, which is seen by a user, may be significantly decreased.

Second, before the non-display region is folded, a manufacturing margin with respect to a dead space may be sufficiently assured, so that it is not necessary to reduce the number of circuits or wirings or to decrease a line width.

Third, in a case where an encapsulation member is formed as a thin film, the non-display region is folded to cover a side surface of the thin film, so that penetration of impurities through the side surface of the thin film may be prevented or reduced, and thus a lifetime of an organic light-emitting display apparatus may be extended.

Fourth, in a case where the encapsulation member is formed as an inflexible encapsulation substrate, and the inflexible encapsulation substrate is adhered by using a sealant, a lifetime of the organic light-emitting display apparatus may be extended, compared to a case of using the thin film.

Fifth, in a case where a flexible substrate is supported by a supporting substrate, shaking or vibration of the flexible substrate may be stabilized or reduced so that the mechanical reliability of the organic light-emitting display apparatus may be increased.

In the drawings, the thicknesses or sizes of the elements of the embodiments of the present invention may be exaggerated for clarity, and thus should not be construed as shown in the drawings.

While the present invention has been particularly shown and described with reference to exemplary embodiments thereof, it will be understood by those of ordinary skill in the art that various changes in form and details may be made therein without departing from the spirit and scope of the present invention as defined by the following claims and equivalents thereof.

What is claimed is:

1. An organic light-emitting display apparatus comprising:
a flexible substrate having a display region and a non-display region located at an outer region of the display region, the flexible substrate being folded at the non-display region with respect to the flexible substrate at the display region;
at least one organic light-emitting diode (OLED) on the display region of the flexible substrate;
an encapsulation member disposed on the display region; and
a supporting substrate on a surface of the flexible substrate opposite to a surface on which the display region is formed,
wherein the flexible substrate at the non-display region is folded toward the supporting substrate.

2. The organic light-emitting display apparatus of claim 1, wherein the encapsulation member comprises an inflexible substrate, and
the organic light-emitting display apparatus further comprises a sealant that adheres the inflexible substrate and the flexible substrate together, wherein the sealant surrounds the display region.

3. The organic light-emitting display apparatus of claim 2, wherein the inflexible substrate comprises a glass substrate.

4. The organic light-emitting display apparatus of claim 2, wherein the sealant comprises a glass frit.

5. The organic light-emitting display apparatus of claim 2, wherein the sealant comprises an organic sealant.

6. The organic light-emitting display apparatus of claim 1, wherein the supporting substrate comprises a glass substrate.

7. The organic light-emitting display apparatus of claim 1, wherein the size of the supporting substrate is less than the size of the flexible substrate.

8. The organic light-emitting display apparatus of claim 1, wherein the non-display region is folded to cover a side surface of the supporting substrate.

9. The organic light-emitting display apparatus of claim 1, wherein the flexible substrate comprises a plastic substrate.

10. The organic light-emitting display apparatus of claim 1, further comprising a barrier layer that is formed on the flexible substrate and is formed between the display region and the non-display region.

11. The organic light-emitting display apparatus of claim 1, further comprising:
an emitting unit that comprises the at least one OLED; and
a device/wiring layer on the flexible substrate and comprising a device and a wiring that are electrically connected to the at least one OLED.

12. The organic light-emitting display apparatus of claim 1, further comprising a driving circuit unit and a wiring unit at the non-display region, wherein the driving circuit unit and the wiring unit are electrically connected to the display region.

13. A method of manufacturing an organic light-emitting display apparatus, the method comprising:
(a) forming a flexible substrate on a supporting substrate, the flexible substrate having a display region and a non-display region at an outer region of the display region;
(b) forming at least one organic light-emitting diode (OLED) on the display region of the flexible substrate;
(c) forming an encapsulation member on the flexible substrate to encapsulate the display region;
(d) separating a region of the supporting substrate corresponding to the non-display region from the flexible substrate; and
(e) folding the flexible substrate at the non-display region with respect to the flexible substrate at the display region, such that the flexible substrate at the non-display region is folded toward the supporting substrate.

14. The method of claim 13, wherein (a) comprises forming the flexible substrate as a plastic substrate.

15. The method of claim 13, further comprising, after (a), forming a barrier layer on the flexible substrate.

16. The method of claim 13, wherein (c) comprises forming the encapsulation member as an inflexible substrate, and adhering the inflexible substrate and the flexible substrate together by using a sealant.

17. The method of claim 16, wherein the inflexible substrate is formed as a glass substrate.

18. The method of claim 16, wherein the sealant comprises a glass frit.

19. The method of claim 16, wherein the sealant comprises an organic sealant.

20. The method of claim 13, wherein, in (e), the non-display region is folded to cover a side surface of the supporting substrate.

* * * * *